(12) United States Patent
Wei

(10) Patent No.: US 12,327,791 B2
(45) Date of Patent: Jun. 10, 2025

(54) INTEGRATED CIRCUIT STRUCTURES WITH GATE CUTS ABOVE BURIED POWER RAILS

(71) Applicant: Intel Corporation, Santa Clara, CA (US)

(72) Inventor: Andy Chih-Hung Wei, Yamhill, OR (US)

(73) Assignee: Intel Corporation, Santa Clara, CA (US)

( * ) Notice: Subject to any disclaimer, the term of this patent is extended or adjusted under 35 U.S.C. 154(b) by 797 days.

(21) Appl. No.: 17/209,304

(22) Filed: Mar. 23, 2021

(65) Prior Publication Data

US 2022/0310514 A1 Sep. 29, 2022

(51) Int. Cl.
*H10D 30/62* (2025.01)
*H01L 23/528* (2006.01)
(Continued)

(52) U.S. Cl.
CPC ..... *H01L 23/5286* (2013.01); *H10D 30/6219* (2025.01); *H10D 84/0149* (2025.01); *H10D 84/038* (2025.01); *H10D 84/834* (2025.01)

(58) Field of Classification Search
CPC . H01L 23/5286; H01L 23/485; H01L 23/535; H01L 23/5386; H01L 27/0886;
(Continued)

(56) References Cited

U.S. PATENT DOCUMENTS 10,020,381 B1 7/2018 Fan et al.
11,004,855 B2 * 5/2021 Wang ................ H01L 29/41791
(Continued)

FOREIGN PATENT DOCUMENTS

EP 3454366 A1 3/2019
EP 3671825 A1 6/2020
(Continued)

OTHER PUBLICATIONS

Final Office Action in U.S. Appl. No. 16/812,428 dated Nov. 9, 2021, 28 pages.
(Continued)

*Primary Examiner* — Ida M Soward
(74) *Attorney, Agent, or Firm* — Akona IP PC

(57) ABSTRACT

An example IC structure includes a plurality of elongated channel structures (e.g., fins or nanoribbons) and one or more metal gate lines crossing over the fins/nanoribbons. A buried power rail (BPR) is formed between a pair of adjacent fins/nanoribbons. Once a BPR has been formed, an opening is formed above the BPR. The opening has an elongated shape that extends horizontally along the length of the BPR and extends vertically from the top of the BPR to the top of the IC structure, cutting through the metal gate lines. Portions of the opening between cut portions of metal gate lines may be filled with a dielectric material, thus forming metal gate cuts. A portion of the opening that is not between cut portions of a metal gate line is filled with an electrically conductive material and coupled to a source/drain contact of a transistor, thus forming a conductive via.

20 Claims, 13 Drawing Sheets

(51) Int. Cl.
    *H10D 84/01*         (2025.01)
    *H10D 84/03*         (2025.01)
    *H10D 84/83*         (2025.01)

(58) Field of Classification Search
    CPC ............ H01L 27/088; H01L 29/41791; H01L 29/42356; G11C 5/08; G11C 5/10; G11C 5/063; H10D 30/6219; H10D 84/834; H10D 18/60; H10D 18/48345; H10F 30/2863; H10F 77/955; H01H 20/8314
    See application file for complete search history.

(56) References Cited

U.S. PATENT DOCUMENTS

| | | | |
|---|---|---|---|
| 2018/0040719 A1 | 2/2018 | Wang et al. | |
| 2018/0053694 A1 | 2/2018 | Cheng et al. | |
| 2018/0069000 A1 | 3/2018 | Bergendahl et al. | |
| 2018/0261514 A1 | 9/2018 | Xie et al. | |
| 2018/0294267 A1* | 10/2018 | Licausi | H10D 84/853 |
| 2018/0350810 A1 | 12/2018 | Bergendahl et al. | |
| 2018/0374951 A1 | 12/2018 | Jambunathan et al. | |
| 2019/0013246 A1 | 1/2019 | Wallace et al. | |
| 2019/0067277 A1 | 2/2019 | Tsai et al. | |
| 2019/0067290 A1 | 2/2019 | Wang et al. | |
| 2019/0067417 A1 | 2/2019 | Ching et al. | |
| 2019/0080969 A1* | 3/2019 | Tsao | H01L 29/6681 |
| 2019/0164805 A1 | 5/2019 | Chou et al. | |
| 2019/0164837 A1 | 5/2019 | Hung et al. | |
| 2019/0164839 A1 | 5/2019 | Tsai et al. | |
| 2019/0165178 A1 | 5/2019 | Chen et al. | |
| 2019/0348367 A1 | 11/2019 | Fu et al. | |
| 2019/0348516 A1 | 11/2019 | Ramaswamy et al. | |
| 2020/0006075 A1 | 1/2020 | Wang et al. | |
| 2020/0006112 A1* | 1/2020 | Licausi | H10B 12/056 |
| 2020/0006334 A1 | 1/2020 | Hsueh et al. | |
| 2020/0075428 A1 | 3/2020 | Venigalla et al. | |
| 2020/0083222 A1 | 3/2020 | Kim et al. | |
| 2020/0098681 A1 | 3/2020 | Kim et al. | |
| 2020/0105603 A1 | 4/2020 | Chang et al. | |
| 2020/0135578 A1 | 4/2020 | Ching et al. | |
| 2020/0176318 A1 | 6/2020 | Jang et al. | |
| 2020/0373331 A1 | 11/2020 | Kim et al. | |
| 2021/0074697 A1 | 3/2021 | Baek et al. | |
| 2021/0098309 A1 | 4/2021 | Min et al. | |
| 2021/0098471 A1 | 4/2021 | Chen et al. | |
| 2021/0134722 A1 | 5/2021 | Zhang et al. | |
| 2021/0280708 A1* | 9/2021 | Wei | H01L 29/785 |
| 2021/0335783 A1* | 10/2021 | Chiu | H01L 29/78696 |
| 2021/0384128 A1* | 12/2021 | Wang | H01L 21/76897 |
| 2022/0157722 A1* | 5/2022 | Bouche | H01L 29/0673 |

FOREIGN PATENT DOCUMENTS

| | | |
|---|---|---|
| EP | 4002452 A1 | 5/2022 |
| TW | 202002004 A | 1/2020 |
| TW | 202020978 A | 6/2020 |

OTHER PUBLICATIONS

Non Final Office Action in U.S. Appl. No. 16/812,428 dated Jun. 29, 2021, 12 pages.

* cited by examiner

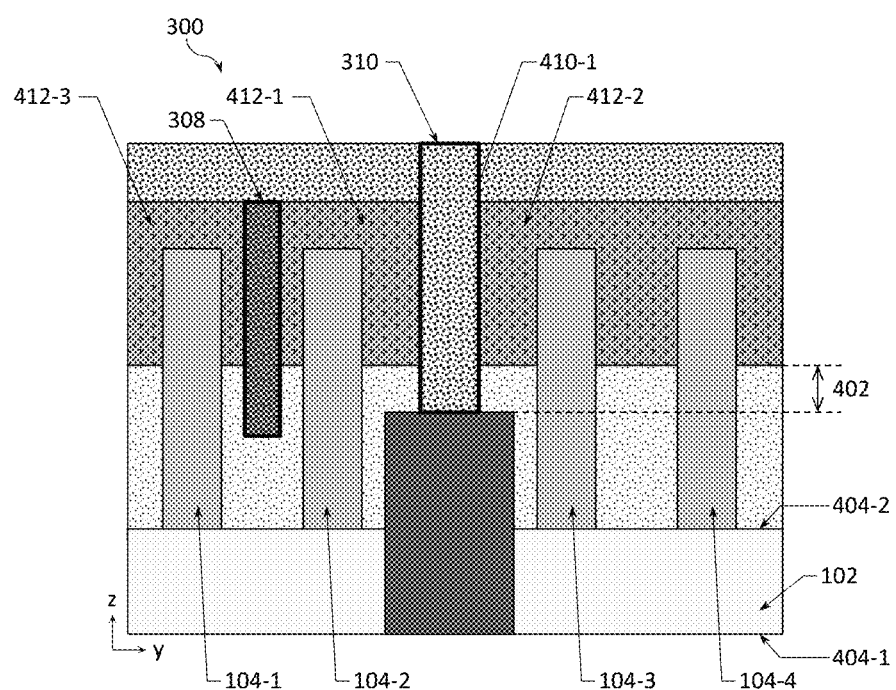

INTEGRATED CIRCUIT STRUCTURES WITH GATE CUTS ABOVE BURIED POWER RAILS

TECHNICAL FIELD

This disclosure relates generally to the field of semiconductor devices, and more specifically, to integrated circuit (IC) structures.

BACKGROUND

A field-effect transistor (FET), e.g., a metal-oxide-semiconductor (MOS) FET (MOSFET), is a three-terminal device that includes source, drain, and gate terminals and uses electric field to control current flowing through the device. A FET typically includes a semiconductor channel material, a source and a drain regions provided in the channel material, and a gate stack that includes at least a gate electrode material and may also include a gate dielectric material, the gate stack provided over a portion of the channel material between the source and the drain regions. Because gate electrode materials often include metals, gates of transistors are commonly referred to as "metal gates."

Recently, FETs with non-planar architectures, such as FinFETs (also sometimes referred to as "wrap-around gate transistors" or "tri-gate transistors") and nanoribbon/nanowire transistors (also sometimes referred to as "all-around gate transistors"), have been extensively explored as alternatives to transistors with planar architectures.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
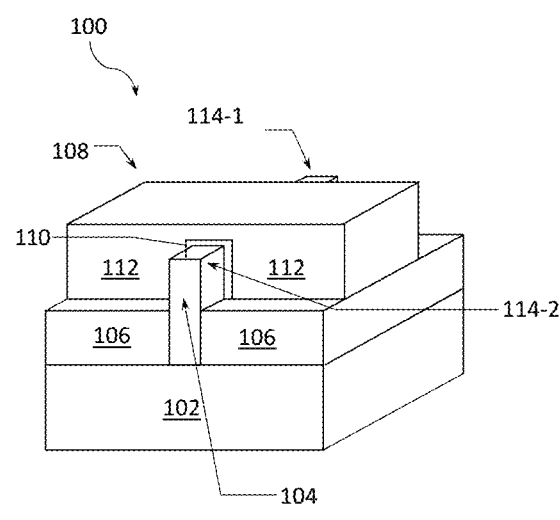
FIG. 1 is a perspective view of an example FinFET, according to some embodiments of the disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC structures with gate cuts above BPRs, proposed herein, it might be useful to first understand phenomena that may come into play in such structures. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of transistors being implemented as FinFETs, embodiments of the present disclosure are equally applicable to IC structures employing transistors of other architectures, such as nanoribbon or nanowire transistors, as well as to planar transistors.

As described above, recently, FETs with non-planar architectures, such as FinFETs and nanoribbon/nanowire transistors, have been extensively explored as alternatives to transistors with planar architectures.

In a FinFET, a semiconductor structure shaped as a fin extends away from a base (e.g., from a semiconductor substrate), and a gate stack may wrap around the upper portion of the fin (i.e., the portion farthest away from the base), potentially forming a gate on 3 sides of the fin. The portion of the fin around which the gate stack wraps around is referred to as a "channel" or a "channel portion" of a FinFET. A semiconductor material of the channel portion is commonly referred to as a "channel material" of the transistor. A source region and a drain region are provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel portion" of a nanoribbon transistor is the portion of the nanoribbon around which the gate stack wraps around. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (i.e., a cross-section in a plane perpendicular to the longitudinal axis of the structure), while the term "nanowire" has been used to describe a similar structure but with a substantially circular transverse cross-section.

Taking FinFETs as an example, oftentimes, fabrication of an IC device having an array of FinFETs involves, first, providing a plurality of fins (typically parallel to one another), and then providing metal gate lines that cross over multiple fins. Often, but not always, the metal gate lines are provided substantially perpendicular to the lengths, or longitudinal axes, of the fins, the metal gate lines provided in a plane substantially parallel to the plane of the support structure on which the fins are formed. A metal gate line crossing a first fin of the plurality of fins may form a gate of a transistor in the first fin, while the metal gate line crossing an adjacent second fin may form a gate of a transistor in the second fin. Since the metal gate line crosses over both the first and the second fins, the metal gate line is electrically continuous over the first and second fins, thereby providing an electrical coupling between the gate of the transistor in the first fin and the gate of the transistor in the second fin. In a later part of a fabrication process, it may be desirable to disrupt this continuity, e.g., if the design is such that it requires that the gate of the transistor in the first fin is decoupled from the gate of the transistor in the second fin. Also, in a later part of a fabrication process, trench contacts are formed, where, as used herein, the term "trench contact" refers to a structure that is supposed to provide electrical connectivity to (i.e., is a contact) to source or drain (S/D) contacts of a transistor. In addition, gate contacts are formed, where the term "gate contact" refers to a structure that is supposed to provide electrical connectivity to (i.e., is a contact) to a gate (i.e., to a gate metal line) of a transistor.

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device becomes increasingly significant and such optimization is far from trivial.

As the dimensions of IC devices are ever-decreasing, disrupting the electrical continuity of a metal gate line (a process commonly referred to as a "metal gate cut") to decouple gates of transistors on adjacent fins in a manner that is sufficiently accurate, cost-efficient, and does not inadvertently compromise performance of an IC device is far from trivial. One conventional approach includes using a combination of masks and materials that are sufficiently etch-selective to selectively etch the gate electrode materials in areas where the metal gate line is to be disrupted. Two materials may be described as "sufficiently etch-selective" if etchants used to etch one material do not substantially etch the other material, and vice versa. Selective etch is typically an isotropic etch, meaning that a given material is etched substantially in all directions, and may result in significant bloating of the actual gate cut relative to the desired shape. In extreme cases, lateral encroachment of such gate cuts may disable one or more fins.

Described herein are IC structures with gate cuts above BPRs. An example IC structure includes a plurality of elongated channel structures (e.g., fins or nanoribbons) of one or more semiconductor materials, provided over a support structure (e.g., a substrate, a wafer, a die, or a chip) substantially parallel to one another. One or more metal gate lines, substantially parallel to one another, may cross over the channel structures so that the metal gate lines are substantially perpendicular to the channel structures. The metal gate lines are elongated structures of one or more gate electrode materials provided over portions of the channel structures (e.g., wrapping around at least portions of the channel structures) to form gates of transistors in the structures. A power rail may be formed between a pair of adjacent channel structures. The power rail is referred to as a "rail" because one or more electrically conductive materials of the power rail are shaped as an elongated structure, e.g., an elongated structure that is substantially parallel to the channel structures. The power rail is referred to as a "power" rail because it is configured to provide power to various portions of transistors formed along the channel structures (e.g., to source regions or contacts of various transistors). Furthermore, the power rail may be referred to as a "buried" power rail (i.e., a BPR) because the one or more electrically conductive materials of the power rail are below the one or more gate electrode materials of the metal gate lines (i.e., the top of the one or more electrically conductive materials of the power rail is closer to the support structure than the bottom of the one or more gate electrode materials of the metal gate lines). Once a BPR has been formed, an opening may be formed above the BPR, the opening having an elongated shape that extends along the length of the power rail in a horizontal direction and extends from the top of the BPR to the top of the IC structure (e.g., to the top of the metal gate lines) in a vertical direction. Because the BPR and, hence, the opening are substantially parallel to the elongated channel structures, they are substantially perpendicular to the metal gate lines, which means that the opening would cut through the metal gate lines. Portions of the opening between cut portions of metal gate lines may be filled with one or more dielectric materials, thus forming metal gate cuts, referred in the following as "BPR gate cuts" or "gate cuts above BPR(s)." A portion of the opening that is not between cut portions of a metal gate line, e.g., a portion of the opening that is opposite a source contact of a transistor formed in an adjacent channel structure, may be filled with one or more electrically conductive materials which may further be coupled to the source contact of a transistor, thus forming an electrically conductive via, referred in the following as a "BPR via", that electrically couples the BPR to the source contact of the transistor.

IC structures with gate cuts above BPRs, as described herein, may provide several advantages. Forming both the BPR metal gate cuts and the BPR via in the same opening above the BPR advantageously reduces the area required to form the gate cut and BPR via, as well as the number of masks and process steps for forming metal gate cuts and electrical connections from the BPR to transistor portions, reducing complexity and cost of a fabrication process. Providing the electrically conductive material(s) of a power rail in the opening in between the channel structures, as opposed to being provided over the channel structures, may provide improvements in terms of reduced metal line resistance and reduced voltage droop. Making sure that the top of the power is below the metal gate lines (i.e., making sure that the power rail is buried) may provide further improvements in terms of reduced parasitic capacitance. In some embodiments, the BPR may extend all the way through the support structure so that an electrical connection to the power rail may, advantageously, be provided from the back side of the support structure. Furthermore, in some embodiments, a mask for a trench contact that is to be used to electrically couple the BPR to a source region of a transistor may be simultaneously used as a mask when the one or more electrically conductive materials of the BPR via are deposited. Using such a mask will result in formation of a BPR via that is self-aligned to the trench contact in at least one direction (e.g., in the direction parallel to the length of the BPR). BPRs with self-aligned BPR vias to trench contacts as described herein may be used to address scaling challenges of conventional transistor arrangements and enable high density arrangements compatible with advanced complementary metal-oxide-semiconductor (CMOS) processes. Other technical effects will be evident from various embodiments described here.

Elongated structures are mentioned throughout the present description. As used herein, a structure is referred to as an elongated if a length of the structure (measured alone one axis of an example coordinate system) is greater than both a width of the structure (measured alone another axis of the example coordinate system) and a height of the structure (measured alone a third axis of the example coordinate system). For example, elongated channel structures as described herein may be fins or nanoribbons, having a length measured along an x-axis of the coordinate system shown in the present drawings, a width measured along a y axis of the coordinate system shown in the present drawings, and a height measured along a z-axis of the coordinate system shown in the present drawings. Because BPRs described herein, as well as openings above them, are substantially parallel to the channel structures, their lengths, widths, and heights are also measured along, respectively, an x-axis, a y axis, and a z-axis of the x-y-z coordinate system shown in the present drawings. On the other hand, when the metal gate lines are substantially perpendicular to the channel structures, as shown in the embodiments of the present drawings, their lengths, widths, and heights are measured along, respectively, a y axis, an x-axis, and a z-axis of the x-y-z coordinate system shown.

While descriptions provided herein refer to FinFETs, these descriptions are equally applicable to embodiments any other non-planar FETs besides FinFETs, e.g., to nanoribbon transistors, nanowire transistors, or transistors such as nanoribbon/nanowire transistors but having transverse cross-sections of any geometry (e.g., oval, or a polygon with rounded corners).

IC structures as described herein, in particular IC structures with gate cuts above BPRs as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials, and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 7A-7B, such a collection may be referred to herein without the letters, e.g., as "FIG. 7."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of fins, a certain number of metal gate lines, a certain number of gate cuts, a certain number of stacked trench contacts, etc.), this is simply for ease of illustration, and more, or less, than that number may be included in an IC structure with at least one gate cut above at least one BPR as described herein. Still further, various views shown in some of the drawings are intended to show relative arrangements of various elements therein. In other embodiments, various IC structures with gate cuts above BPRs as described herein, or portions thereof, may include other elements or components that are not illustrated (e.g., transistor portions, various components that may be in electrical contact with any of the metal lines, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of IC structures with gate cuts above BPRs as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D" region/contact to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of an IC chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example FinFET

Figure 3:
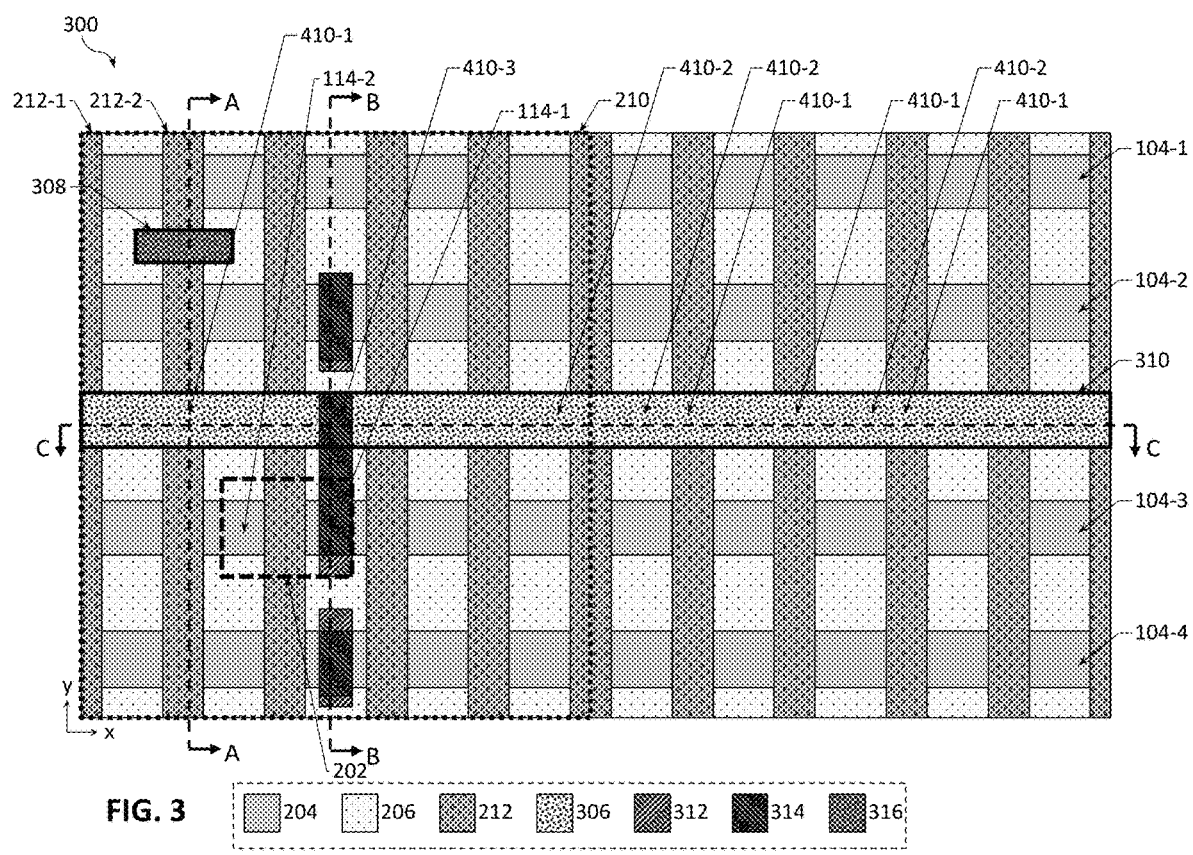
FIG. 3 is a top-down view of the IC structure of FIG. 2 with a gate cut above a BPR, according to some embodiments of the disclosure.

FIG. 1 is a perspective view of an example FinFET 100, according to some embodiments of the disclosure. The FinFET 100 illustrates one example of transistors that may be implemented in various IC structures described herein, e.g., in the IC structures with gate cuts above BPRs as shown in FIGS. 3-5. The FinFET 100 shown in FIG. 1 is intended to show relative arrangement(s) of some of the components therein. In various embodiments, the FinFET 100, or portions thereof, may include other components that are not illustrated (e.g., any further materials, such as spacer materials, surrounding the gate stack of the FinFET 100, electrical contacts to the S/D regions of the FinFET 100, etc.).

As shown in FIG. 1, the FinFET 100 may be provided over a support structure 102, where the term "support structure" (which may also be referred to as a "base") may refer to any suitable support structure on which a transistor may be built, e.g., a substrate, a die, a wafer, or a chip. As also shown in FIG. 1, the FinFET 100 may include a fin 104, extending away from the support structure 102. A portion of the fin 104 that is closest to the support structure 102 may be enclosed by an insulator material 106, commonly referred to as a "shallow trench isolation" (STI). The portion of the fin 104 enclosed on its' sides by the STI 106 is typically referred to as a "subfin portion" or simply a "subfin." As further shown in FIG. 1, a gate stack 108 that includes at least a layer of a gate electrode material 112 and, optionally, a layer of a gate dielectric 110, may be provided over the top and sides of the remaining upper portion of the fin 104 (e.g., the portion above and not enclosed by the STI 106), thus wrapping around the upper-most portion of the fin 104. The portion of the fin 104 over which the gate stack 108 wraps around may be referred to as a "channel portion" (or, simply, a "channel") of the fin 104 because this is where, during operation of the FinFET 100, a conductive channel may form. The channel portion of the fin 104 is a part of an active region of the fin 104. A first S/D region 114-1 and a second S/D region 114-2 (also commonly referred to as "diffusion regions") are provided on the opposite sides of the gate stack 108, forming source and drain terminals of the FinFET 100.

In general, implementations of the present disclosure may be formed or carried out on a support structure such as a semiconductor substrate, composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which IC structures with gate cuts above BPRs as described herein may be built falls within the spirit and scope of the present disclosure. In various embodiments, the support structure 102 may include any such substrate material that provides a suitable surface for forming the FinFET 100.

As shown in FIG. 1, the fin 104 may extend away from the support structure 102 and may be substantially perpendicular to the support structure 102. The fin 104 may include one or more semiconductor materials, e.g., a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions may be formed during operation of a transistor.

As shown in FIG. 1, the STI material 106 may enclose the sides of the fin 104. A portion of the fin 104 enclosed by the STI 106 forms a subfin. In various embodiments, the STI material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1. In particular, the gate dielectric 110 may wrap around the upper-most portion of the fin 104, and the gate electrode 112 may wrap around the gate dielectric 110. The interface between the channel portion of the fin 104 and the subfin portion of the fin 104 is located proximate to where the gate electrode 112 ends.

The gate electrode 112 may include one or more gate electrode materials, where the choice of the gate electrode materials may depend on whether the FinFET 100 is a P-type metal-oxide-semiconductor (PMOS) transistor or an N-type metal-oxide-semiconductor (NMOS) transistor. For a PMOS transistor, gate electrode materials that may be used in different portions of the gate electrode 112 may include, but are not limited to, ruthenium, palladium, platinum, cobalt, nickel, and conductive metal oxides (e.g., ruthenium oxide). For an NMOS transistor, gate electrode materials that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where zero or more materials of the stack are workfunction materials and at least one material of the stack is a fill metal layer. Further materials/layers may be included next to the gate electrode 112 for other purposes, such as to act as a diffusion barrier layer or/and an adhesion layer.

If used, the gate dielectric 110 may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

In some embodiments, the gate stack 108 may be surrounded by a dielectric spacer, not specifically shown in FIG. 1. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, e.g., the subfin portion of the fin 104, may be surrounded by the STI material 106 which may, e.g., include any of the high-k dielectric materials described herein.

In some embodiments, the fin 104 may be composed of semiconductor material systems including, for example, N-type or P-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as e.g., Si or Ge. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example N-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e., a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter ($cm^{-3}$), and advantageously below $10^{13}$ $cm^{-3}$. The subfin portion of the fin 104 may be a III-V material having a band offset (e.g., conduction band offset for N-type devices) from the channel portion. Example materials include, but are not limited to, GaAs, GaSb, GaAsSb, GaP, InAlAs, GaAsSb, AlAs, AlP, AlSb, and AlGaAs. In some N-type transistor embodiments of the FinFET 100 where the channel portion of the fin 104 is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 104 each include group IV semiconductors (e.g., Si, Ge, SiGe). The subfin of the fin 104 may be a first elemental semiconductor (e.g., Si or Ge) or a first SiGe alloy (e.g., having a wide bandgap).

For some example P-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. The subfin of the fin 104 may be a group IV material having a band offset (e.g., valance band offset for P-type devices) from the channel portion. Example materials include, but are not limited to, Si or Si-rich SiGe. In some P-type transistor embodiments, the subfin of the fin 104 is Si and at least a portion of the subfin may also be doped with impurities (e.g., N-type) to a higher impurity level than the channel portion.

Turning to the first S/D region 114-1 and the second S/D region 114-2 on respective different sides of the gate stack 108, in some embodiments, the first S/D region 114-1 may be a source region and the second S/D region 114-2 may be a drain region. In other embodiments this designation of source and drain may be interchanged, i.e., the first S/D region 114-1 may be a drain region and the second S/D region 114-2 may be a source region. Although not specifically shown in FIG. 1, the FinFET 100 may further include S/D electrodes (also commonly referred to as "S/D contacts"), formed of one or more electrically conductive materials, for providing electrical connectivity to the S/D regions 114, respectively. Such S/D contacts are shown as S/D contacts 408 in FIGS. 4B and 5B. In some embodiments, the S/D regions 114 of the FinFET 100 may be regions of doped semiconductors, e.g., regions of doped channel material of the fin 104, so as to supply charge carriers for the transistor channel. In some embodiments, the S/D regions 114 may be highly doped, e.g., with dopant concentrations of about $1·10^{21}$ $cm^{-3}$, in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g., higher than a dopant concentration in a region of the semiconductor channel material between the first S/D region 114-1 and the second S/D region 114-2, and, therefore, may be referred to as "highly doped" (HD) regions.

In some embodiments, the S/D regions 114 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the fin 104 to form the S/D regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the S/D regions 114). Such S/D contacts are shown, e.g., in FIGS. 4B and 5B of the present drawings.

The FinFET 100 may have a gate length, GL, (e.g., a distance between the first S/D region 114-1 and the second S/D region 114-2), a dimension measured along the fin 104 in the direction of the x-axis of the example reference coordinate system x-y-z shown in FIG. 1, which may, in some embodiments, be between about 5 and 40 nanometers, including all values and ranges therein (e.g., between about 10 and 35 nanometers, or between about 15 and 25 nanometers). The fin 104 may have a thickness, a dimension measured in the direction of they axis of the reference coordinate system x-y-z shown in FIG. 1, that may, in some embodiments, be between about 4 and 15 nanometers, including all values and ranges therein (e.g., between about 5 and 10 nanometers, or between about 7 and 12 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g., between about 30 and 200 nanometers, between about 75 and 250 nanometers, or between about 150 and 300 nanometers).

Although the fin 104 illustrated in FIG. 1 is shown as having a rectangular cross-section in a z-y plane of the reference coordinate system shown in FIG. 1, the fin 104 may instead have a cross-section that is rounded or sloped at the "top" of the fin 104, and the gate stack 108 (including the different portions of the gate dielectric 110) may conform to this rounded or sloped fin 104. In use, the FinFET 100 may form conducting channels on up to three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate).

While FIG. 1 illustrates a single FinFET 100, in some embodiments, a plurality of FinFETs may be arranged next to one another (with some spacing in between) along the fin 104.

Example IC Structures with Gate Cuts Above BPRs

Figure 2:
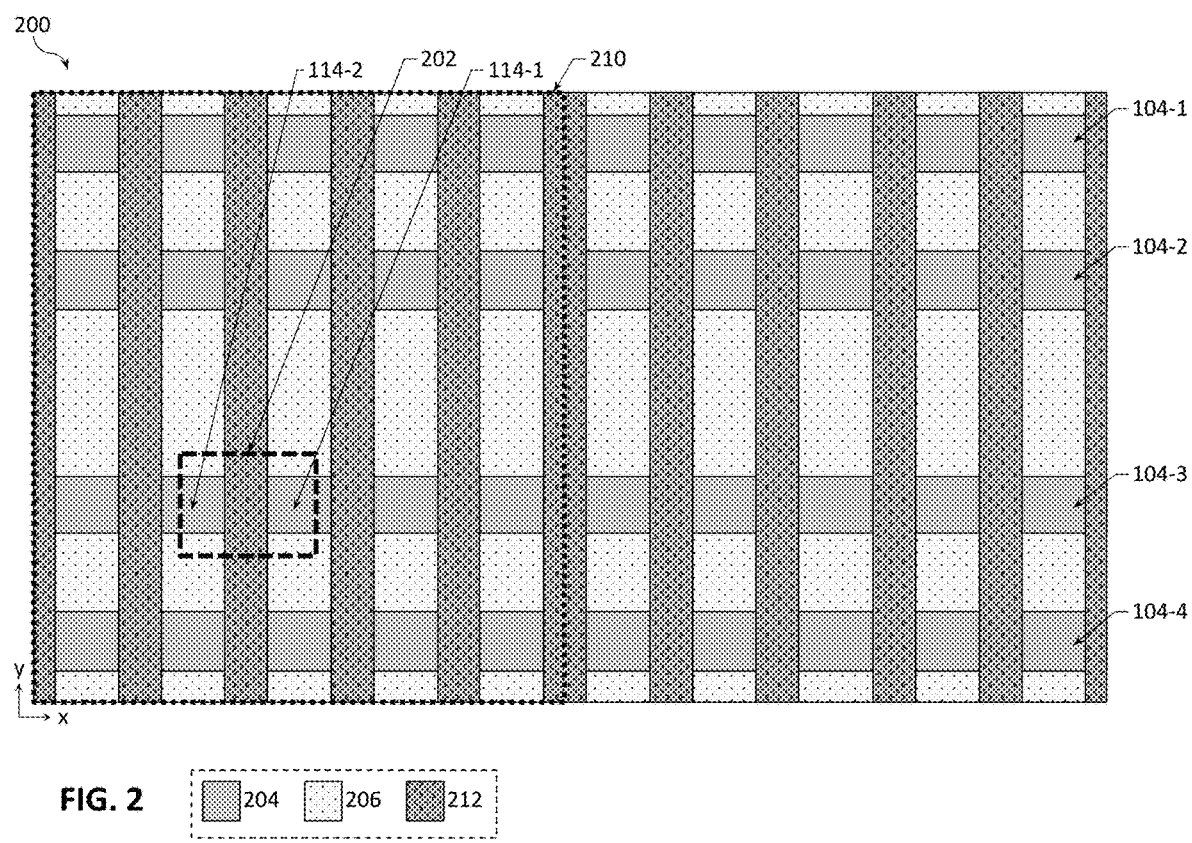
FIG. 2 is a top-down view of an example IC structure in which at least one gate cut above a buried power rail (BPR) may be implemented, according to some embodiments of the disclosure.

FIGS. 2 and 3 provide top-down views (i.e., the views of the x-y plane of the example reference coordinate system shown in FIG. 1) of an example IC structure in which at least one gate cut above at least one BPR may be implemented, according to various embodiments of the disclosure. In particular, FIG. 2 illustrates an IC structure 200 without any gate cuts above BPRs, while FIG. 3 illustrates an IC structure 300 with a gate cut above a BPR, according to some embodiments of the disclosure.

A legend provided within a dashed box at the bottom of FIGS. 2 and 3 illustrates colors/patterns used to indicate some portions or materials of some of the elements shown in FIGS. 2 and 3, so that these drawings are not cluttered by too many reference numerals (the same holds for subsequent drawings of the present disclosure that include a legend at the bottom of the drawings). For example, FIGS. 2 and 3 use different colors/patterns to identify a channel material 204 (e.g., the channel material of the fins 104), a dielectric material 206, and metal gate lines 212. In addition, FIG. 3 further uses different colors/patterns to identify a dielectric material 306 of a BPR gate cut, a first trench contact (TCN1) material 312, a second trench contact (TCN2) material 314, and a dielectric material 316 of a gate cut that is not a BPR gate cut (i.e., of a gate cut that is not above a BPR). The BPR is not shown in FIG. 3 because it is not visible underneath the dielectric materials 306 and 206.

The IC structures shown in FIGS. 2 and 3, and in some of the subsequent drawings, are examples of how a plurality of the FinFETs 100 may be arranged in an IC device. Therefore, the IC structures shown in FIGS. 2-3 and in some of the subsequent drawings illustrate some elements labeled with the same reference numerals as those used in FIG. 1 to indicate similar or analogous elements in these drawings, so that, in the interests of brevity, descriptions of a given element provided with reference to one drawing does not have to be repeated again for other drawings. For example, FIGS. 2 and 3 illustrate the fin 104 (in particular, a plurality of such fins), and example S/D regions 114 for one example FinFET of the IC structures of FIGS. 2 and 3. The same holds for subsequent drawings of the present disclosure—elements with reference numerals used in one drawing and shown again in another drawing refer to similar or analogous elements so that their descriptions do not have to be repeated for each drawing.

The IC structures shown in FIGS. 2 and 3 are intended to show relative arrangement(s) of some of the components therein in order to illustrate some details of implementing gate cuts above BPRs. The IC structures shown in FIGS. 2 and 3 are not real top-down views that would be seen if an IC structure is to be cut along an x-y plane in that they do not show some materials in order to not obscure the illustration of the details of gate cuts above BPRs. For example, FIGS. 2 and 3 illustrate the channel material 204 of the fins 104, although, in a real cross-section along an x-y plane above (e.g., at the top) of the metal gate lines 212, the fins 104 would not be visible because they would be covered by a dielectric material, e.g., by the dielectric material 206 and/or the dielectric material 306. In another example, FIG. 3 illustrates the TCN2 material 314, although, as can be seen in, e.g., FIG. 4B, in a top-down view where the TCN2 material 314 is seen other portions of the IC structure may be covered with the dielectric material 306 (i.e., the dielectric material 306 would extend beyond just the fill of the BPR gate cut but FIG. 3 does not illustrate that). Thus, in various embodiments, the IC structures shown in FIGS. 2 and 3, or portions thereof, may include other components that are not illustrated (e.g., any further materials, such as spacer materials, STI, S/D regions or electrical contacts thereto, etc.). Same holds for subsequent drawings of the present disclosure.

As shown in FIG. 2, the IC structure 200 may include a channel material 204 shaped into a plurality of elongated channel structures such as the fins 104, which, in some embodiments, may extend substantially parallel to one another, with their lengths being measured along the x-axis. Different instances of the fins 104 are shown in FIG. 2 with a dash and a different reference numeral after the reference numeral for the fin, 104 (the same notation is used for other elements in other drawings). The IC structure 200 illustrates an example of 4 fins 104, labeled as fins 104-1 through 104-4, but, in other embodiments, any other number of two or more fins 104 may be implemented in the IC structure 200. Moreover, in other embodiments, the channel material 204 may be shaped into elongated channel structures other than fins, e.g., in nanoribbons or nanowires, but such other elongated channel structures may also be represented by the top-down view of the channel material as shown in FIGS. 2 and 3.

Once the fins 104 are fabricated, metal gate lines 212 may be provided over the fins 104, crossing multiple fins 104. In some embodiments, the metal gate lines 212 may extend substantially perpendicular to the fins 104. For example, if the fins 104 extend in the direction of the x-axis of the example coordinate system used in the present drawings, as shown in FIG. 2 (i.e., if each of the fins 104 may have a long axis substantially parallel to the support structure over which they are provided (e.g., the support structure 102) and different fins 104 may extend substantially parallel to one another), then the metal gate lines 212 may extend in the direction of the y axis, as is shown in FIG. 2. In some embodiments, the metal gate lines 212 may be shaped as ridges, substantially perpendicular to the length of the fins 104 and enclosing different portions of the fins 104. At least portions of the metal gate lines 212 provided over the fins 104, i.e., where gates of FinFETs may be formed, as described with reference to FIG. 1, may include one or more of the gate electrode materials 112, thus forming gate stacks 108, described above. In some embodiments, all of the metal gate lines 212 (i.e., also between the fins 104) are formed of one or more of the gate electrode material 112. In some embodiments, the gate electrode material 112 used in one portion of a given metal gate line 212 may have a material composition that is different from the material composition of the gate electrode material 112 used in another portion of that particular metal gate line 212. For example, the material composition of a portion of a given metal gate line 212 crossing the fins 104 in which NMOS transistors are to be formed may be different from the material composition of a portion of that metal gate line 212 crossing the fins 104 in which PMOS transistors are to be formed. For example, the fins 104-1 and 104-4 may be fins in which NMOS transistors can be formed, while the fins 104-2 and 104-3 may be fins in which PMOS transistors can be formed.

A dashed contour shown in FIG. 2 illustrates an example of a transistor 202 formed in/along one of the fins 104 (hence, the transistor 202 is a FinFET), namely, in the fin 104-3. The FinFET 202 may be an example of the FinFET 100, described above. FIG. 2 illustrates the S/D regions 114-1 and 114-2 for the FinFET 202, and a portion of the metal gate line 212 crossing the fin 104-3 forms the gate stack 108 of the FinFET 202. A plurality of other such FinFETs are also shown in FIG. 2, although they are not specifically labeled with reference numerals in order to not clutter the drawings.

In some embodiments, a plurality of FinFETs 202 may be arranged to form a cell unit (or, simply, a "cell") 210 with a particular logic function/functionality (the approximate outline of the cell unit 210 shown in FIG. 2 with a dotted contour), and such cells may then be provided multiple times in the IC structure 200, e.g., in an array form. Of course, in other embodiments of the IC structure 200, the FinFETs 202 may be arranged in ways that do not include repeating cell units and/or the cell unit 210 may include portions of the IC structure 200 other than what is shown in FIG. 2.

FIG. 2 further illustrates that portions of the IC structure 200 surrounding the upper portions of the fins 104 may be enclosed by a dielectric material 206, which may include one or more of the dielectric spacer materials or interlayer dielectric (ILD) materials described herein. Although the top-down view of FIG. 2 illustrates the tops of the fins 104 in the portions where the metal gate lines 212 are not crossing the fins, in some embodiments, the dielectric material 206 may cover the tops of the fins 104 in those portions (in which case the fins 104 would not be visible in the top-down view of the IC structure 200).

Figure 4A:
FIGS. 4A-4C provide cross-sectional side views of the IC structure of FIG. 3 with cross-sections taken along various planes, according to some embodiments of the disclosure.
Figure 4B:
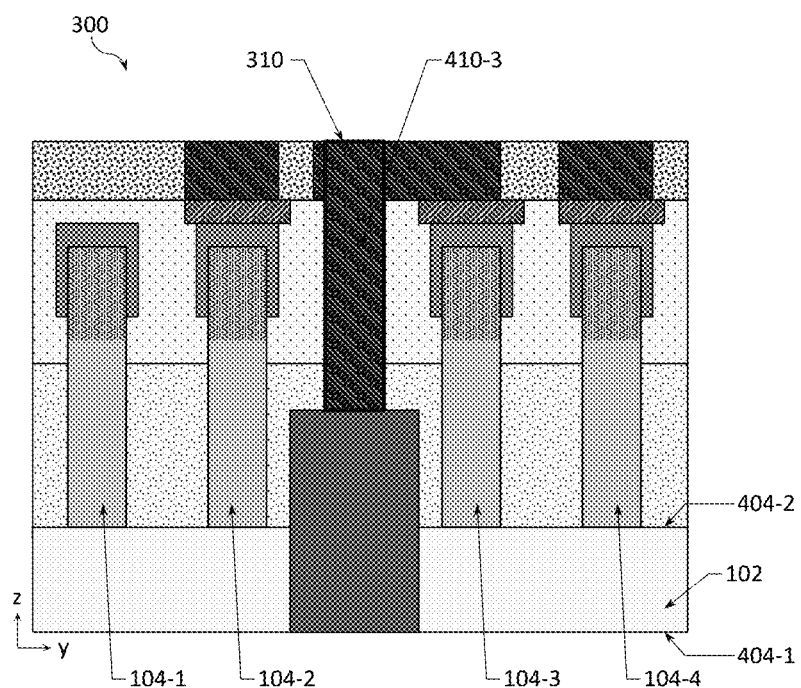
Figure 4B:
Figure 4C:
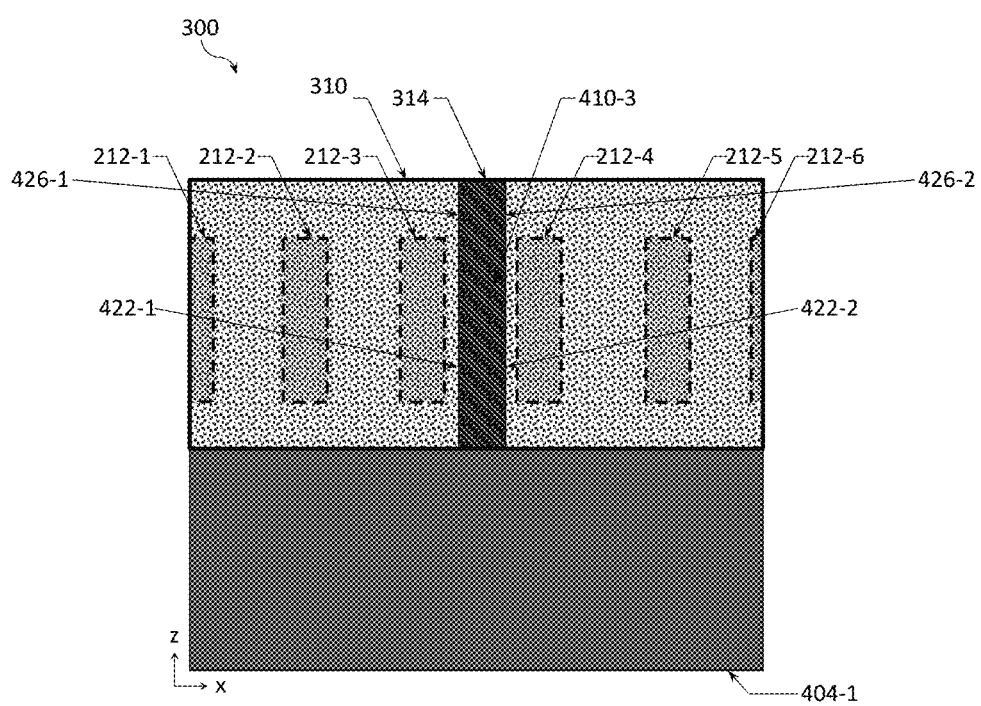
Figure 4C:

As described above, a given design may require that some of the metal gate lines 212 are cut to accommodate a BPR. In some further embodiments, a given design may require that some of the metal gate lines 212 are cut to disrupt the electrical continuity between different portions of the IC structure 200 and decouple the gates of different FinFETs 202. FIG. 3 is a top-down view of an IC structure 300 that is similar to the IC structure 200 of FIG. 2, further illustrating an example gate cut above a BPR, according to some embodiments of the disclosure. In particular, FIG. 3 illustrates an outline of an opening 310 above a BPR and the dielectric material 306 of a BPR gate cut, as well as the TCN1 material 312 and the TCN2 material 314. The outline of the opening 310 is shown in FIG. 3 as a thick black rectangular contour surrounding all of the dielectric material 306 and a portion of the TCN2 material 314. Portions of the opening 310 filled with the dielectric material 306 provide BPR gate cuts as these portions cut one or more of the metal gate lines 212 and are provided above a BPR (the BPR itself is not shown in FIG. 3 because it is below the opening 310, but it can be seen in the cross-sectional illustrations of FIGS. 4A-4C). However, the outline of the opening 310 as shown in FIGS. 4A-4C is not necessarily a material demarcation. For example, in FIG. 4A, the dielectric material 306 may be continuously a single material inside and outside of the outline of the opening 310. In another example, in FIGS. 4B and 4C, the electrically conductive material 314 may be continuously a single material inside and outside of the outline of the opening 310. FIG. 3 further illustrates an opening 308 filled with the dielectric material 316. The opening 308 also provides a gate cut in that it cuts one of the metal gate lines 212, but it is not a BPR gate cut because it is not provided above a BPR (which can be seen better from the cross-sectional illustrations of FIGS. 4A-4C). FIGS. 4A-4C provide cross-sectional side views of the IC structure 300 of FIG. 3 with cross-sections taken along various planes, according to some embodiments of the disclosure. In particular, FIG. 4A illustrates a cross-section of the IC structure 300 taken along a plane AA shown in FIG. 3 (i.e., a cross-section of a y-z plane along one of the metal gate lines 212), FIG. 4B illustrates a cross-section of the IC structure 300 taken along a plane BB shown in FIG. 3 (i.e., a cross-section of a y-z plane in between the adjacent metal gate lines 212, along BPR via), and FIG. 4C illustrates a cross-section of the IC structure 300 taken along a plane CC shown in FIG. 3 (i.e., a cross-section of an x-z plane along the BPR and along an opening above the BPR, in which opening the BPR gate cut and the BPR via are formed). Together, the various views of FIG. 3 and FIGS. 4A-4C provide a comprehensive illustration of the IC structure 300. Therefore, details of the IC structure 300 will now be described with reference to elements that may be seen in one of the views of FIGS. 3 and 4 but not in others.

FIGS. 4A and 4B show a BPR 320, provided between two adjacent fins, e.g., between the fin 104-2 and the fin 104-3. The BPR 320 may include one or more electrically conductive materials. In some embodiments, various electrically conductive materials described herein, e.g., the one or more electrically conductive materials of the BPR 320, may include one or more metals or metal alloys with metals such as copper, ruthenium, palladium, platinum, cobalt, nickel, hafnium, zirconium, titanium, tantalum, molybdenum, tungsten and aluminum. In some embodiments, the electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide), or nitrides (e.g., hafnium nitride, zirconium nitride, titanium nitride, tantalum nitride, and aluminum nitride) of one or more metals.

The BPR 320 may have a length measured along the x-axis and be substantially parallel to the fins 104. Thus, in a horizontal direction, the BPR 320 extends substantially parallel to and between the two adjacent fins 104-2 and 104-3. The BPR 320 is "buried" because the top of the BPR 320 (i.e., the boundary of the BPR 320 that is farthest away from the support structure 102) is below the metal gate lines 212, as can be seen in the view of FIG. 4A. For example, in some embodiments, the top of the BPR 320 may be below the bottom of the metal gate line 212 by a distance 402, illustrated in FIG. 4A, where the distance 402 may be at least 5 nanometers, including all values and ranges, e.g., at least 7 nanometers or at least 10 nanometers. Thus, in a vertical direction, the BPR 320 may extend from some plane below the metal gate lines 212, e.g., a plate at the distance 402 from the metal gate lines 212, and extend down towards the support structure 102, possibly extending all the way through the support structure. This is shown in, e.g., FIG. 4A where the BPR 320 extends from a first face 404-1 of the support structure 102 to a second face 404-2 of the support structure 102. In this manner, an electrical connection to the BPR 320 may be made at the back of the support structure 102 (i.e., at the first face 404-1). The fins 104 are then provided over the second face 404-2 of the support structure 102.

Analysis of the opening 310 from the various views offered by FIG. 3 and FIGS. 4A-4C reveals that the opening 310 extends, in a horizontal direction, to be parallel to and above the BPR 320 (i.e., the bottom of the opening 310 fully overlaps with the top of the BPR 320), while, in a vertical direction, the opening 310 extends from the top of the BPR 320 (i.e., the bottom of the opening 310 is at the distance 402 from the bottom of the metal gate lines 212 and is coplanar with the top of the BPR 320) to the top of the gate electrode material of the metal gate line 212. Because the opening 310 extends from the top of the dielectric material 306 all the way down to the BPR 320, the opening 310 cuts through the metal gate lines 212, effectively separating the gate electrode material of each metal gate line 212 into two portions. This can be seen in the view of FIG. 4A where the opening 310 separates the gate electrode material of the metal gate line 212 into a first portion 412-1 and a second portion 412-2. A portion of the opening 310 that is between the first and second portions 412-1 and 412-2 of the cut gate metal line 212, which is labeled in FIG. 4A as a portion 410-1 of the opening 310, may be filled with one or more dielectric materials, e.g., the dielectric material 306. Although the cross-section of FIG. 4A illustrates the portion 410-1 of the opening 310 to be fully filled with the dielectric material 306, in other embodiments the fill of the portion 410-1 may be partial (e.g., only at sidewalls and/or a bottom of the opening 310). The dielectric material 306 may include any of the dielectric materials described above, e.g., any of the ILD materials or spacer dielectric materials. In this manner, the portion 410-1 of the opening 310 that is between the first and second portions 412-1 and 412-2 of the gate electrode material of the gate metal line 212 forms a gate cut of that gate metal line 212 (i.e., it electrically isolates the first and second portions 412-1 and 412-2 from one another) and is what is called a BPR gate cut. Therefore, in the following, the portion 410-1 is referred to as a "BPR gate cut 410-1." The top-down view of FIG. 3 labels a few instances of BPR gate cuts 410-1 (i.e., metal gate cuts provided by the portion 410-1 of the opening 310 cutting through and electrically isolating portions of a single gate metal line 212 from one another). However, in general, a BPR gate cut may be formed wherever a portion of the opening 310 electrically isolates the first and second portions 412-1 and 412-2 of a given gate electrode material of the gate metal line 212. In turn, the first portion 412-1 of the gate electrode material of this gate metal line 212 may at least partially wrap around a portion of one channel structure (e.g., the fin 104-2 in the example of the IC structurer 300), while the second portion 412-2 of the gate electrode material of this gate metal line 212 may at least partially wrap around a portion of another channel structure (e.g., the fin 104-3 in the example of the IC structurer 300).

The top-down view of FIG. 3 illustrates that the opening 310 extends along the x-axis so that, besides the opening 310 having BPR gate cuts 410-1 every time the opening 310 cuts through another metal gate line 212, there are also portions of the opening 310 between adjacent metal gate lines 212, i.e., along the x-axis direction. Some of those portions may be at least partially filled with the dielectric material 306, as can be seen in FIG. 3 with portions of the opening 310 that are labeled as portions 410-2. However, at least one portion of the opening 310 that is between a pair of adjacent gate metal lines 212 may be filled with one or more electrically conductive materials, such portion of the opening 310 labeled as a portion 410-3 in FIG. 3 and can be seen in the cross-section view of FIG. 4B. The portion 410-3 forms a BPR via that may be configured to electrically couple the BPR 320 to a S/D contact of the transistor 202. Therefore, in the following, the portion 410-3 is referred to as a "BPR via 410-3."

In contrast to the BPR gate cuts 410-1, the BPR via 410-3 is not between the first and second portions 412-1, 412-2 of the gate electrode material of any of the metal lines 212. In some embodiments, the BPR via 410-3 may be opposite a S/D contact of a transistor formed in an adjacent channel structure, e.g., opposite a S/D contact to the first S/D region 114-1. This is illustrated in the view of FIG. 4B, showing that the BPR via 410-3 may be opposite a S/D contact 408 that is coupled to the S/D region 114 of one of the fins 104 (namely, the S/D contact 408 is coupled to the S/D region 114 of the fin 104-3 in the illustration of FIG. 4B, and of FIG. 3). As shown in FIG. 4B, the S/D contact 408 of the fin 104-3 may be coupled to (e.g., in conductive contact with) the TCN1 312, and the TCN1 312 may be coupled to (e.g., in conductive contact with) the TCN2 314, which is then coupled to (e.g., in conductive contact with) the BPR via 410-3. In turn, the BPR via 410-3 is coupled to (e.g., in conductive contact with) the BPR 320. However, in other embodiments, electrical connections between the BPR 320 and various components of the IC structure in which the BPR 320 may be implemented may be realized in many other ways, all of which being within the scope of the present disclosure. For example, even though FIG. 3 illustrates the BPR 320 being coupled to the source region 114 of the transistor 202 which is provided along the fin 104-3, in other embodiments, the BPR 320 could be coupled to the source region 114 of a transistor provided along the fin 104-2 of FIG. 3.

Each of the BPR via 410-3, the S/D contacts 408, the TCN1 312, and the TCN2 314 may be made of one or more electrically conductive materials, such as those described above (e.g., with reference to the BPR 320), and, in various embodiments, their individual material compositions may be the same or different. In some embodiments, material compositions of the BPR via 410-3 and the TCN2 314 may be substantially the same (as is illustrated in FIG. 4B with the same pattern used to show these elements), e.g., if the BPR via 410-3 and the TCN2 314 are fabricated by, first forming openings for both the BPR via 410-3 and the TCN2 314, and then filling the openings with an electrically conductive material in a single metallization process.

FIG. 4C provides yet another illustrative cross-section of the IC structure 300, depicting different metal gate lines 212 in the back of the plane of the drawing of FIG. 4C with dashed contours. The different metal gate lines 212 are labeled in FIG. 4C as metal gate lines 212-1 through 212-6, corresponding to the illustration of FIG. 3, although FIG. 3 only shows labels for the metal gate lines 212-1 and 212-2 and not the rest of the lines, in order to not clutter the drawing. In some embodiments, the BPR via 410-3 may be self-aligned, in the direction of the x-axis of the example coordinate system shown, to the TCN2 314 that it is coupled to, which can be inferred from the top-down view of the IC structure 300 (i.e., FIG. 3) and seen in the cross-sectional view of FIG. 4C. In other words, the one or more electrically conductive materials of the BPR via 410-3 may be self-aligned to the one or more electrically conductive materials of the TCN2 314 in a direction parallel to the length of the BPR 320 (i.e., in the direction of the x-axis of the example coordinate system shown). In this context, self-alignment may mean that one sidewall of the BPR via 410-3 (e.g., a sidewall 422-1, shown in FIG. 4C) may be in a single plane with one sidewall of the TCN2 314 to which it is coupled (e.g., a sidewall 426-1, shown in FIG. 4C), and another sidewall of the BPR via 410-3 (e.g., a sidewall 422-2, shown in FIG. 4C) may be in a single plane with another sidewall of the TCN2 314 to which it is coupled (e.g., a sidewall 426-2, shown in FIG. 4C). This can be inferred from FIG. 3, where the BPR via 410-3 is not seen because it is below the TCN2 314 to which it is coupled. For the ideal case where the sidewalls of the BPR via 410-3 and the TCN2 314 are perpendicular to the support structure 102, the first pair of self-aligned (i.e., single plane) sidewalls may be the sidewalls along a first y-z plane, while the second pair of self-aligned (i.e., single plane) sidewalls may be the sidewalls along a second y-z plane, at a distance that is equal to the dimension of the BPR via 410-3 in the x-axis direction. However, analogous self-alignment considerations are also applicable to the non-ideal cases of where the sidewalls of the BPR via 410-3 and the TCN2 314 are not 100% perpendicular to the support structure 102. The self-alignment of the BPR via 410-3, in the direction of the x-axis of the example coordinate system shown, to the TCN2 314 that it is coupled to may be a result of an opening for the BPR via 410-3 being formed, within the dielectric material 306 filling the opening 310, using a mask for the TCN2 314.

The present drawings illustrate that the TCN2 314 may completely overlap the BPR via 410-3 in the direction of the y axis. However, in other embodiments (not specifically shown in the present drawings), the TCN2 314 may only partially overlap the BPR via 410-3. In other words, in some embodiments, the one or more electrically conductive materials of the TCN2 314 does not fully overlap the one or more electrically conductive materials of the BPR via 410-3 in a direction perpendicular to the length of the BPR 320 and parallel to the support structure 102 (i.e., in the direction of they axis of the example coordinate system shown). This may be due to a cut of the TCN2 314 after the BPR via 410-3 is formed.

Because both the BPR gate cut 410-1 and the BPR via 410-3 are formed within the opening 310, their widths (i.e., dimensions measured along the x-axis of the example coordinate system shown), may be substantially the same. In some embodiments, their width (and, therefore, the width of the opening 310) may be smaller than the width of the BPR 320, as is shown with the embodiments of FIGS. 4A and 4B. However, in other embodiments, the width of the opening 310 may be substantially the same as the width of the BPR 320, e.g., as is shown in FIGS. 5A and 5B and described below.

Figure 5A:
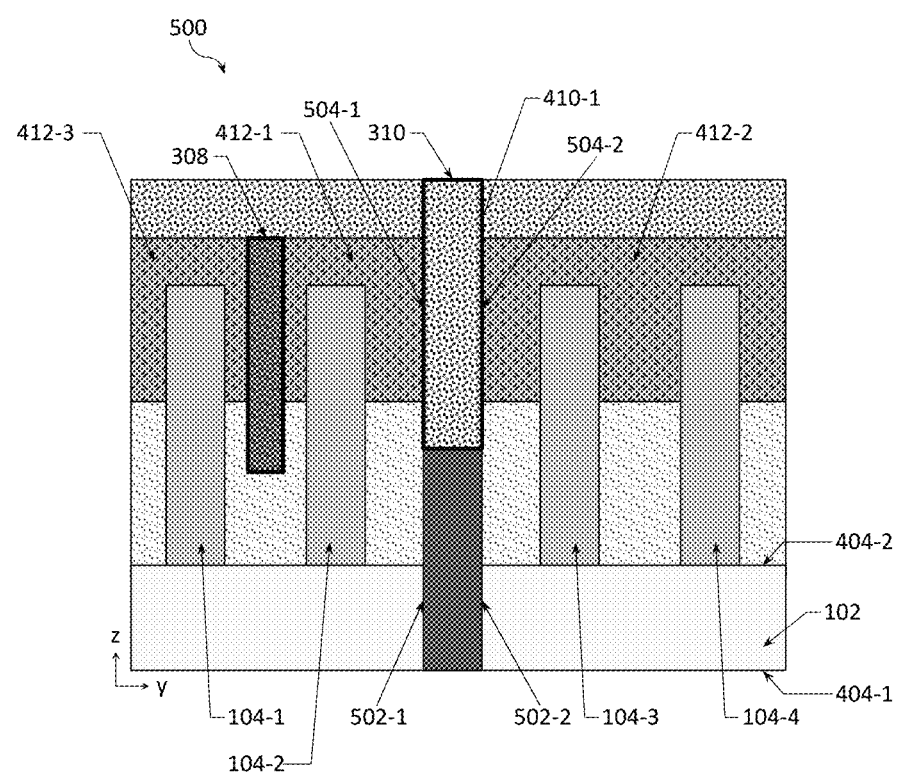
FIGS. 5A-5B provide cross-sectional side views of the IC structure of FIG. 3 with cross-sections taken along various planes, according to other embodiments of the disclosure.
Figure 5B:
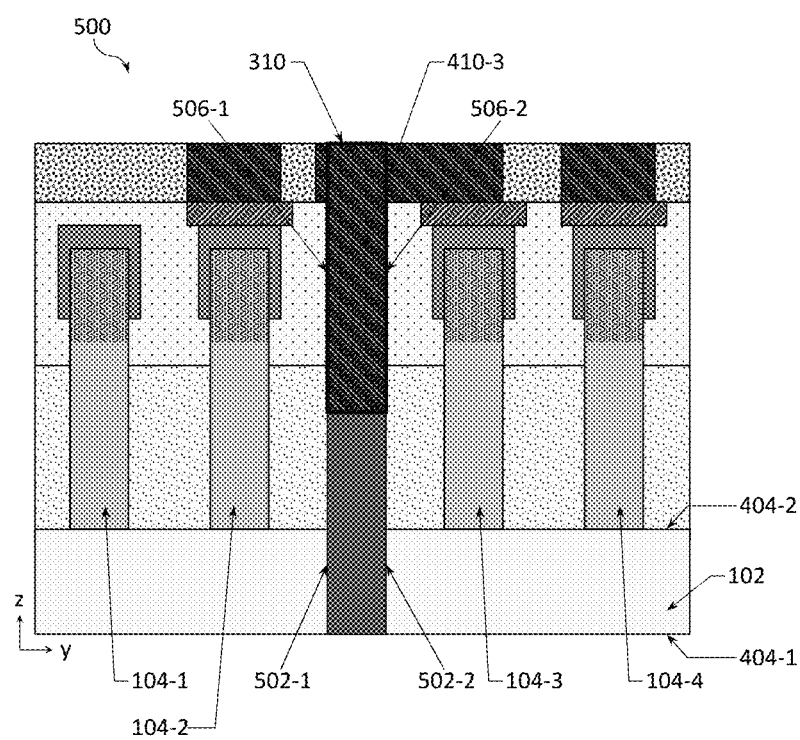

FIGS. 5A and 5B illustrate an IC structure 500 that is similar to the IC structure 300 except that, in the IC structure 500, the width of the opening 310 may be substantially the same as the width of the BPR 320. Except for this difference, other descriptions of the IC structure 300 are applicable to the IC structure 500 and, therefore, in the interests of brevity, are not repeated. The embodiment shown in FIGS. 5A and 5B may be advantageous in that an opening similar to the opening 310 may be formed first, extending all the way down into the support structure 102, possibly extending to the first face 404-1 of the support structure 102. Such an opening may then be filled with one or more electrically conductive materials to form the BPR 320 as described herein, and then filled with one or more dielectric materials to form the BPR gate cuts 410-1, and then a portion of the opening may be filled with one or more electrically conductive materials to form the BPR via 410-3, as described herein. In this manner, each of the BPR gate cuts 410-1 and the BPR via 410-3 may be self-aligned to the BPR 320 in a direction perpendicular to the length of the BPR 320 and parallel to the support structure 102 (i.e., in the direction of the y axis of the example coordinate system shown). In this context, self-alignment may mean that a first sidewall 502-1 of the BPR 320 may be in a single plane with a first sidewall 504-1 of the BPR gate cut 410-1 (as is shown in FIG. 5A) and in a single plane with a first sidewall 506-1 of the BPR via 410-3 (as is shown in FIG. 5B), while a second sidewall 502-2 of the BPR 320 may be in a single plane with a second sidewall 504-2 of the BPR gate cut 410-1 (as is shown in FIG. 5A) and in a single plane with a second sidewall 506-2 of the BPR via 410-3 (as is shown in FIG. 5B). Because, as described above, the BPR gate cuts 410-1 and the BPR via 410-3 are formed within a common opening 310, this means that, for a given BPR gate cut 410-1, the first sidewall 504-1 of the BPR gate cut 410-1 is in a single plane with the first sidewall 506-1 of the BPR via 410-3, and the second sidewall 504-2 of the BPR gate cut 410-1 is in a single plane with the second sidewall 506-2 of the BPR via 410-3, both for the IC structure 500 and the IC structure 300. Thus, the sidewalls of the BPR gate cuts 410-1 may be self-aligned with the sidewalls of the BPR via 410-3, both for the IC structure 500 and the IC structure 300.

Turning back to the IC structure 300, but also applicable to the IC structure 500, as shown in FIGS. 3, 4A, and 5A, in some embodiments, the IC structure 300 may further include another metal gate cut, provided in the opening 308. Because the opening 308 is not above the BPR 320 (or any BPR), this metal gate cut may be referred to as a non-BPR gate cut 308. Although the non-BPR gate cut 308 is shown in FIG. 3 to be provided between the fins 104-1 and 104-2 and along a certain metal gate line 212, in other embodiments, location of the non-BPR gate cut 308 may be different.

Similar to the BPR gate cuts 410-1, the non-BPR gate cut 308 may cut through a gate electrode material of a given gate metal line 212, thus separating the gate electrode material into two different portions (e.g., portions 412-1 and 412-3, shown in FIGS. 4A and 5A) which are electrically isolated from one another. To that end, similar to the BPR gate cuts 410-1, the non-BPR gate cut 308 may extend from the top of the gate electrode material that it is intended to cut to below the bottom of that gate electrode material. In some embodiments, the width of the non-BPR gate cut 308 may be smaller than the width of the BPR gate cut 410-1 (e.g., dimensions measured along the y axis of the example coordinate system shown), as is shown in FIGS. 3, 4A, and 5A. However, in other embodiments, the width of the non-BPR gate cut 308 may be equal to or greater than the width of the BPR gate cut 410-1.

Further, in some embodiments, the depth of the BPR gate cut 410-1 may be smaller than the depth of the non-BPR gate cut 308 (e.g., dimensions measured along the z-axis of the example coordinate system shown), as is shown in FIGS. 3, 4A, and 5A. This is because the depth of the BPR gate cut 410-1 is defined by the depth of the recess of the BPR 320 below the metal gate lines 212 (i.e., the BPR gate cut 410-1 is formed within the opening 310 and the opening 310 may be formed by an etch process that is etch-selective with respect to the electrically conductive material of the BPR 320), while the depth of the non-BPR gate cut 308 may be defined by the etch process used to form the opening for the non-BPR gate cut 308 and, therefore, in general, will not be the same as the depth of the BPR gate cut 410-1. Although not specifically shown in the present drawings, in some embodiments, the non-BPR gate cut 308 may have a seam substantially in the center, along the y axis, of the non-BPR gate cut 308 and extending in a vertical direction along ab x-z plane. Such a seam may happen if the non-BPR gate cut 308 is a high-aspect ratio opening, as a result of depositing one or more dielectric materials into the opening for the non-BPR gate cut 308. For example, such a seam may be characteristic of using atomic layer deposition (ALD) deposition to fill the opening for the non-BPR gate cut 308 with the metal gate cut dielectric material.

Similar to the BPR gate cuts 410-1, the non-BPR gate cut 308 may include one or more dielectric materials, e.g., any of the dielectric materials described above. In some embodiments, the BPR gate cuts 410-1 and the non-BPR gate cut 308 may have substantially the same material compositions. However, in other embodiments, material composition of the non-BPR gate cut 308 may be different from that of the BPR gate cuts 410-1, e.g., when these gate cuts are formed and filled in different processes during the fabrication of the IC structure 300 or 500, as illustrated in FIGS. 3, 4A, and 5A with different patterns used to show the BPR gate cuts 410-1 and the non-BPR gate cut 308. In particular, in some embodiments, the dielectric constant of the dielectric material of the non-BPR gate cut 308 may be higher than that of the dielectric material of the BPR gate cuts 410-1, e.g., when the non-BPR gate cut 308 is formed before the BPR gate cuts 410-1 and is filled (at least partially) with a dielectric material that is used as an etch-stop during patterning (e.g., silicon nitride), while the BPR gate cuts 410-1 are filled (at least partially) with a material such as silicon oxide.

Example Fabrication Method

Figure 6:
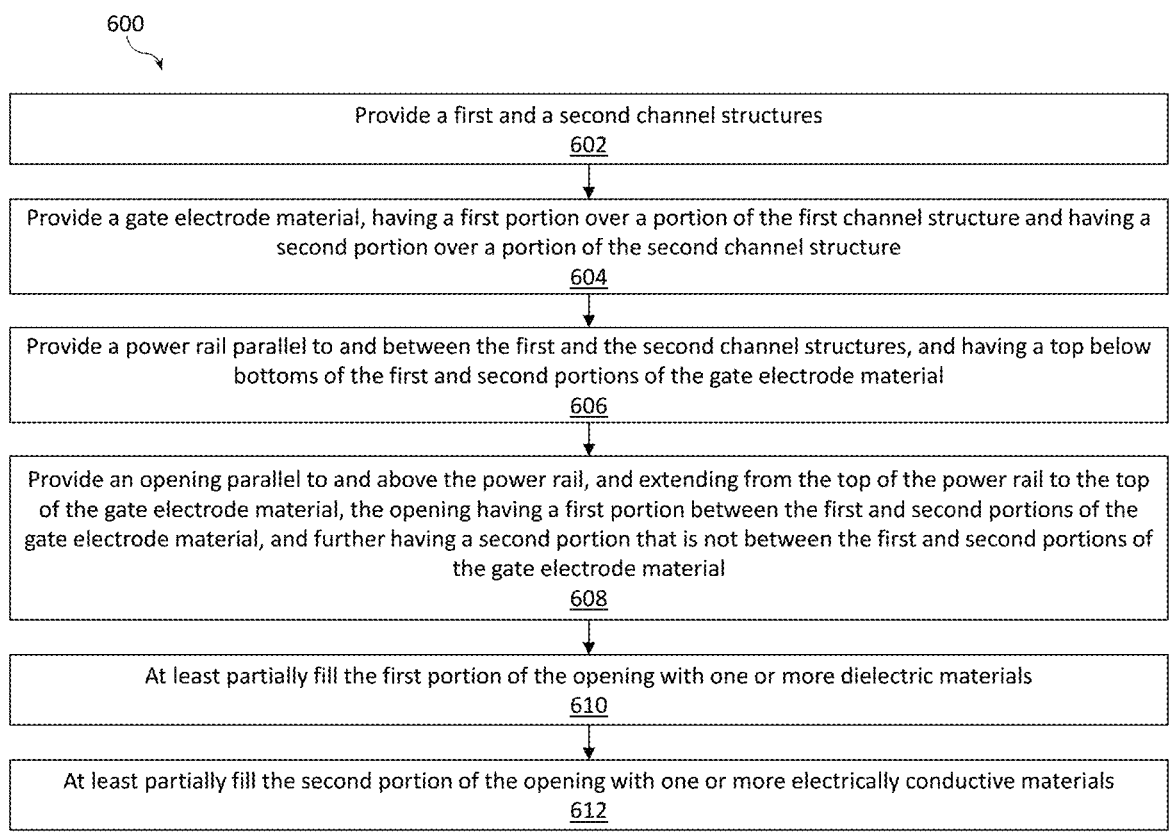
FIG. 6 provides a flow diagram of an example method of manufacturing an IC structure with a BPR and with a gate cut above the BPR, according to one embodiment of the disclosure.

FIG. 6 provides a flow diagram of an example method 600 of manufacturing an IC structure with one or more gate cuts above BPRs, according to one embodiment of the disclosure. For example, the method 600 may be used to manufacture an IC structure such as the IC structure 300, described herein.

Although the operations of the method 600 are illustrated once each and in a particular order, the operations may be performed in any suitable order and repeated as desired. For example, one or more operations may be performed in parallel to manufacture, substantially simultaneously, multiple IC structures with gate cuts above BPRs as described herein. In another example, the operations may be performed in a different order to reflect the structure of a particular device assembly in which one or more IC structures with gate cuts above BPRs as described herein will be included.

In addition, the example manufacturing method 600 may include other operations not specifically shown in FIG. 6, such as various cleaning or planarization operations as known in the art. For example, in some embodiments, a support structure, as well as layers of various other materials subsequently deposited thereon, may be cleaned prior to, after, or during any of the processes of the method 600 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 600 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

As shown in FIG. 6, the method 600 may begin with a process 602, which includes providing a first and a second channel structures (e.g., first and second fins or nanoribbons), the first and second channel structures including one or more semiconductor materials. The method 600 may further include a process 604, which includes providing a gate electrode material, having a first portion at least partially wrapping around a portion of the first channel structure and having a second portion at least partially wrapping around a portion of the second channel structure. The method 600 may further include a process 606, which includes providing a power rail, extending in a horizontal direction to be parallel to and between the first and the second channel structures, and extending in a vertical direction by having a top of the power rail below bottoms of the first and second portions of the gate electrode material. The method 600 may also include a process 608, which includes providing an opening, extending in the horizontal direction to be parallel to and above the power rail, and extending in the vertical direction from the top of the power rail to tops of the first and second portions of the gate electrode material, the opening having a first portion as a portion of the opening that is between the first and second portions of the gate electrode material, and further having a second portion as a portion of the opening that is not between the first and second portions of the gate electrode material. The method 600 may further include a process 610 and a process 612, which include, respectively, at least partially filling the first portion of the opening with one or more dielectric materials, and at least partially filling the second portion of the opening with one or more electrically conductive materials, where the one or more electrically conductive materials are coupled to the power rail.

Variations and Implementations

The IC structures illustrated in and described with reference to FIGS. 1-6 do not represent an exhaustive set of assemblies in which one or more IC structures with gate cuts above BPRs as described herein may be integrated, but merely provide examples of such arrangements. For example, while descriptions and drawings provided herein refer to FinFETs, these descriptions and drawings are equally applicable to embodiments any other non-planar FETs besides FinFETs that are formed on the basis of an elongated channel structure of a suitable channel material, e.g., to nanoribbon transistors, nanowire transistors, or transistors such as nanoribbon/nanowire transistors but having transverse cross-sections of any geometry (e.g., oval, or a polygon with rounded corners). In another example, although particular arrangements of materials are discussed with reference to FIGS. 1-6, intermediate materials may be included in various portions of these drawings. Additionally, while FIGS. 1-6 may illustrate various elements, e.g., various openings shown in FIG. 5, the gate electrode material of the metal gate lines 212, etc., as having perfectly straight sidewall profiles, i.e., profiles where the sidewalls extend perpendicularly to the support structure 102, these idealistic profiles may not always be achievable in real-world manufacturing processes. Namely, while designed to have straight sidewall profiles, real-world openings which may be formed as a part of fabricating various elements of the IC structures illustrated in FIGS. 1-6 may end up having either so-called "non-re-entrant" profiles, where the width at the top of the opening is larger than the width at the bottom of the opening, or "re-entrant" profiles, where the width at the top of the opening is smaller than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of IC structures with gate cuts above BPRs as provided herein are equally applicable to embodiments where various elements of IC structures look different from those shown in the drawings due to manufacturing processes used to form them.

Example Electronic Devices

The IC structures with gate cuts above BPRs, disclosed herein, may be included in any suitable electronic device. For example, the IC structure 300 according to any of the embodiments described herein may be a part of at least one of a memory device, a computing device, a wearable device, a handheld electronic device, and a wireless communications device. FIGS. 7-10 illustrate various examples of assemblies and devices that may include one or more IC structures with gate cuts above BPRs as disclosed herein.

Figures 7A, 7B:
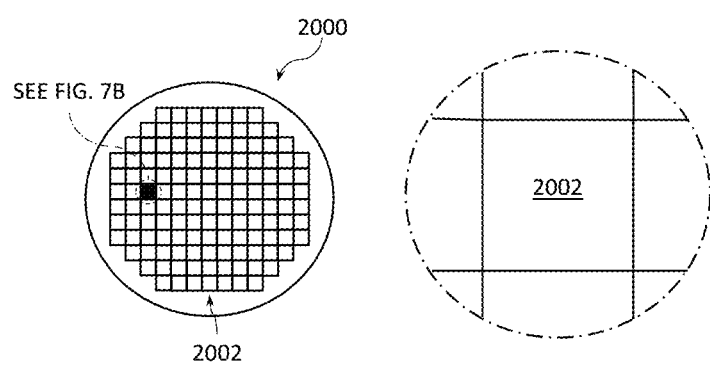
FIGS. 7A and 7B are top views of, respectively, a wafer and dies that may include one or more IC structures with gate cuts above BPRs in accordance with any of the embodiments disclosed herein.

FIGS. 7A-7B are top views of a wafer 2000 and dies 2002 that may include one or more IC structures with gate cuts above BPRs in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 8. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more gate cuts above BPRs as described herein). After the fabrication of the semiconductor product is complete (e.g., after manufacture of one or more layers of an IC structure with at least one gate cut above at least one BPR as described herein), the wafer 2000 may undergo a singulation process in which each of the dies 2002 is separated from one another to provide discrete "chips" of the semiconductor product. In particular, devices that include one or more IC structures with gate cuts above BPRs as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a static RAM (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 10) or other logic that is configured to store information in the memory devices or execute instructions stored in the memory array.

Figure 8:
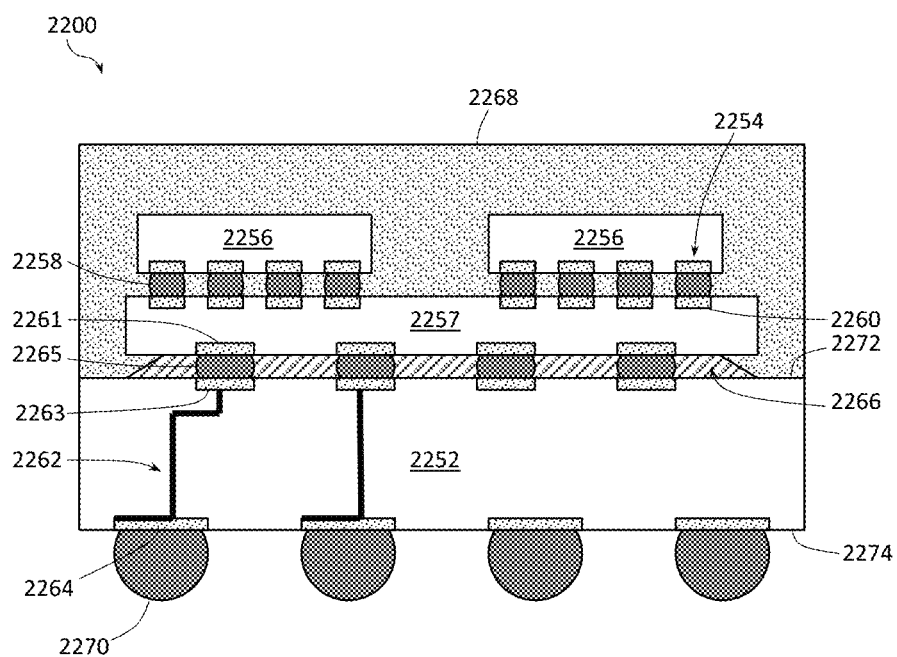
FIG. 8 is a cross-sectional side view of an IC package that may include one or more IC structures with gate cuts above BPRs in accordance with any of the embodiments disclosed herein.

FIG. 8 is a side, cross-sectional view of an example IC package 2200 that may include one or more IC structures with gate cuts above BPRs in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 8 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 8 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 8 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 9.

The dies 2256 may take the form of any of the embodiments of the die 2002 discussed herein (e.g., may include any of the embodiments of the IC structures with gate cuts above BPRs as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more IC structures with gate cuts above BPRs as discussed above; in some embodiments, at least some of the dies 2256 may not include any IC structures with gate cuts above BPRs.

The IC package 2200 illustrated in FIG. 8 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 8, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 9:
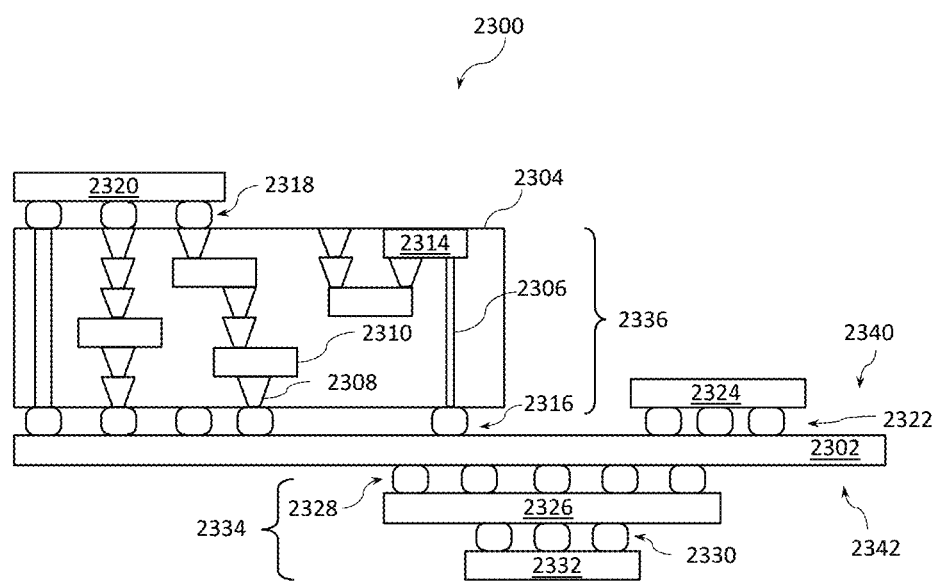
FIG. 9 is a cross-sectional side view of an IC device assembly that may include one or more IC structures with gate cuts above BPRs in accordance with any of the embodiments disclosed herein.

FIG. 9 is a cross-sectional side view of an IC device assembly 2300 that may include components having one or more IC structures with gate cuts above BPRs in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC structures with gate cuts above BPRs in accordance with any of the embodiments disclosed herein; e.g., any of the IC packages discussed below with reference to the IC device assembly 2300 may take the form of any of the embodiments of the IC package 2200 discussed above with reference to FIG. 8 (e.g., may include one or more IC structures with gate cuts above BPRs provided on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 9 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 9), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 7B), an IC device, or any other suitable component. In particular, the IC package 2320 may include one or more IC structures with gate cuts above BPRs as described herein. Although a single IC package 2320 is shown in FIG. 9, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 9, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include any number of metal lines 2310, vias 2308, and through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 9 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 10:
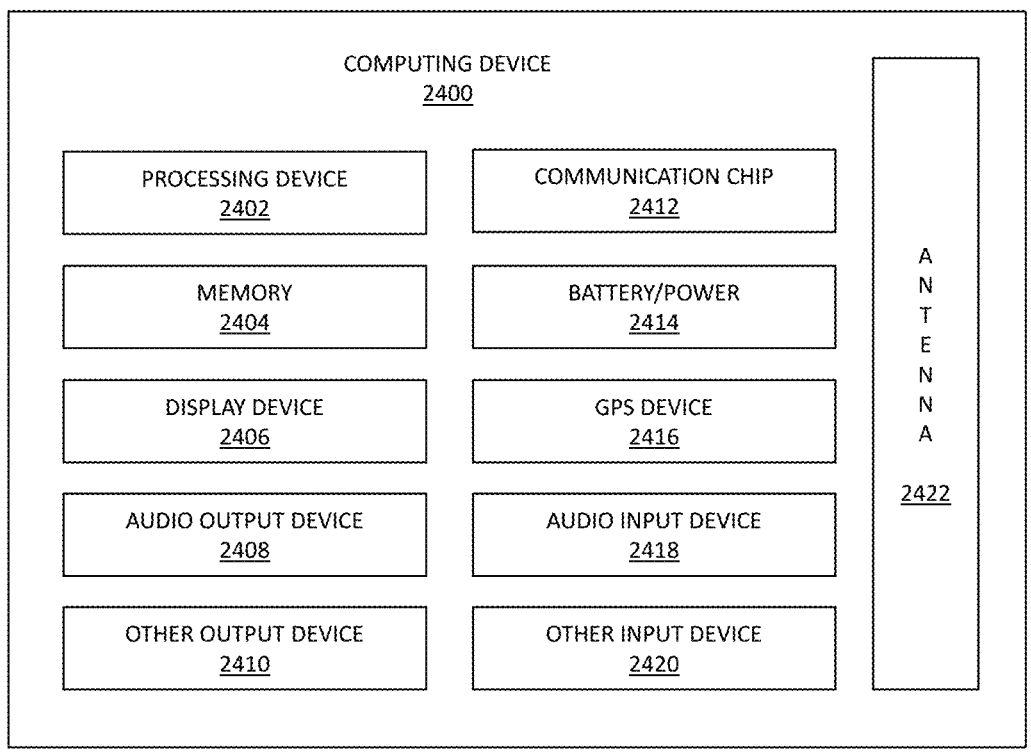
FIG. 10 is a block diagram of an example computing device that may include one or more IC structures with gate cuts above BPRs in accordance with any of the embodiments disclosed herein.

FIG. 10 is a block diagram of an example computing device 2400 that may include one or more components with one or more IC structures with gate cuts above BPRs in accordance with any of the embodiments disclosed herein. For example, any suitable ones of the components of the computing device 2400 may include a die (e.g., the die 2002, shown in FIG. 7B) implementing one or more IC structures with gate cuts above BPRs in accordance with any of the embodiments disclosed herein. Any of the components of the computing device 2400 may include an IC package 2200 (e.g., as shown in FIG. 8). Any of the components of the computing device 2400 may include an IC device assembly 2300 (e.g., as shown in FIG. 9).

A number of components are illustrated in FIG. 10 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system on a chip (SoC) die.

Additionally, in various embodiments, the computing device 2400 may not include one or more of the components illustrated in FIG. 10, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408 but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2", etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna

2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides an IC structure that includes a first and a second channel structures (e.g., first and second fins or nanoribbons), including one or more semiconductor materials; a gate electrode material, having a first portion at least partially wrapping around a portion of the first channel structure and having a second portion at least partially wrapping around a portion of the second channel structure; a power rail, extending in a horizontal direction to be parallel to and between the first and the second channel structures, and extending in a vertical direction by having a top of the power rail below bottoms of the first and second portions of the gate electrode material; and an opening, extending in the horizontal direction to be parallel to and above the power rail, and extending in the vertical direction from the top of the power rail to tops of the first and second portions of the gate electrode material, the opening having a first portion as a portion of the opening that is between the first and second portions of the gate electrode material, and further having a second portion as a portion of the opening that is not between the first and second portions of the gate electrode material. In such an IC structure, the first portion of the opening is at least partially filled with one or more dielectric materials (i.e., the first portion of the opening is a BPR gate cut, also referred to herein as a "gate cut above BPR"), and the second portion of the opening is at least partially filled with one or more electrically conductive materials (i.e., the second portion of the opening is a BPR via).

Example 2 provides the IC structure according to example 1, where a width of the first portion of the opening is substantially equal to a width of the second portion of the opening, where, in the present examples, widths are dimensions measured along a direction parallel to the support structure over which the first and second channel structures are provided and perpendicular to the lengths of the first and second channel structures.

Example 3 provides the IC structure according to examples 1 or 2, where widths of the first and the second portions of the opening are smaller than a width of the power rail.

Example 4 provides the IC structure according to examples 1 or 2, where widths of the first and the second portions of the opening are substantially equal to a width of the power rail.

Example 5 provides the IC structure according to any one of the preceding examples, where the top of the power rail is below the bottoms of the first and second portions of the gate electrode material by at least 5 nanometers, e.g., by at least 7 nanometers or by at least 10 nanometers.

Example 6 provides the IC structure according to any one of the preceding examples, where the one or more electrically conductive materials of the second portion of the opening are in contact with one or more electrically conductive materials of the power rail.

Example 7 provides the IC structure according to any one of the preceding examples, where the one or more electrically conductive materials of the second portion of the opening are electrically coupled to the power rail and to a S/D contact of a transistor, and where either the transistor has a channel that includes a portion of the first channel structure and a gate that includes the first portion of the gate electrode material, or the transistor has the channel that includes a portion of the second channel structure and the gate that includes the second portion of the gate electrode material. In other words, even though FIG. 3 illustrates the BPR 320 being coupled to the S/D region 114 of the transistor 202 which is provided along the fin 104-3, in other embodiments, the BPR 320 could be coupled to the S/D region 114 of a transistor provided along the fin 104-2 of FIG. 3.

Example 8 provides the IC structure according to example 7, further including a first trench contact (TCN1), provided over and electrically coupled to (e.g., in conductive contact with) the S/D contact material of the transistor; and a second trench contact (TCN2), provided over and electrically coupled to (e.g., in conductive contact with) the first trench contact, where the one or more electrically conductive materials of the second portion of the opening are electrically coupled to (e.g., in conductive contact with) the second trench contact and self-aligned to the second trench contact in a direction parallel to a length of the power rail.

Each of the first and second channel structures and the power rail may be an elongated structure having a length measured in a direction of a first axis of a coordinate system (e.g., an x-axis of the example coordinate system shown in the present drawings), a width measured in a direction of a second axis of the coordinate system (e.g., a y axis of the example coordinate system shown in the present drawings), and a height measured in a direction of a third axis of the coordinate system (e.g., a z-axis of the example coordinate system shown in the present drawings), where the length is greater than the width and the height. The second portion of the opening being self-aligned to the second trench contact in a direction parallel to a length of the power rail then means that the second portion of the opening is self-aligned to the second trench contact in a direction of the x-axis.

Example 9 provides the IC structure according to examples 7 or 8, further including a first trench contact (TCN1), provided over and electrically coupled to (e.g., in conductive contact with) the S/D contact material of the transistor; and a second trench contact (TCN2), provided over and electrically coupled to (e.g., in conductive contact with) the first trench contact, where the one or more electrically conductive materials of the second portion of the opening are electrically coupled to (e.g., in conductive contact with) the second trench contact and the second trench contact does not fully overlap with the second portion of the opening in a direction perpendicular to a length of the power rail and parallel to a support structure over which the IC structure is provided. The second trench contact not fully overlapping with the second portion of the opening in a direction perpendicular to a length of the power rail and parallel to a support structure over which the IC structure is provided may mean that the second trench contact does not fully overlap with the second portion of the opening in a direction of the y axis.

Example 10 provides the IC structure according to any one of the preceding examples, where the first portion of the opening electrically isolates the first portion of the gate electrode material from the second portion of the gate electrode material.

Example 11 provides the IC structure according to any one of the preceding examples, where the gate electrode material is a first gate electrode material, the opening is a first opening, the one or more electrically conductive materials are one or more first electrically conductive materials, and the IC structure further includes a third channel structure (e.g., a third fin or nanoribbon), including the one or more semiconductor materials, a second gate electrode material, having a first portion at least partially wrapping around a portion of the third channel structure and having a second portion at least partially wrapping around a portion of the first channel structure, and a second opening that is between the first and second portions of the second gate electrode material and extends from tops of the first and second portions of the second gate electrode material to below bottoms of the first and second portions of the second gate electrode material, where the second opening is at least partially filled with one or more second dielectric materials.

Example 12 provides the IC structure according to example 11, where a width of the second opening is smaller than a width of the first opening.

Example 13 provides the IC structure according to example 11, where a width of the second opening is equal to or greater than a width of the first opening.

Example 14 provides the IC structure according to any one of examples 11-13, further including a seam in the one or more second dielectric materials.

Example 15 provides the IC structure according to any one of examples 11-14, where the IC structure further includes a support structure (e.g., a substrate, a wafer, a chip, or a die), having a first face and an opposing second face, where the first, second, and third channel structures are provided over different portions of the second face of the support structure, and where a distance between the first face of the support structure and a bottom of the second opening is different from a distance between the first face of the support structure and a bottom of the first opening.

Example 16 provides the IC structure according to any one of examples 11-15, where a material composition of the one or more second dielectric materials is different from a material composition of the one or more first dielectric materials.

Example 17 provides the IC structure according to any one of examples 11-16, where a dielectric constant of the one or more first dielectric materials is smaller than a dielectric constant of the one or more second dielectric materials.

Example 18 provides the IC structure according to any one of examples 11-17, where the second opening electrically isolates the first portion of the second gate electrode material from the second portion of the second gate electrode material.

Example 19 provides an electronic device that includes an IC die and a further IC component, coupled to the IC die, where the IC die includes a plurality of channel structures of one or more semiconductor materials, substantially parallel to one another; a plurality of lines of one or more gate electrode materials, substantially parallel to one another, substantially perpendicular to the plurality of channel structures, and at least partially wrapping around portions of the plurality of channel structures; a power rail, substantially parallel to and provided between a first and a second of the plurality of channel structures, where a top of the power rail is below the plurality of lines; a first gate cut, including one or more first dielectric materials and provided over a portion of the power rail so that a portion of a first line of the plurality of lines that at least partially wraps around a portion of the first channel structure is electrically isolated from a portion of the first line that at least partially wraps around a portion of the second channel structure; and a second gate cut, including one or more second dielectric materials and provided between the first and a third of the plurality of channel structures so that a portion of a second line of the plurality of lines that at least partially wraps around a portion of the first channel structure is electrically isolated from a portion of the second line that at least partially wraps around a portion of the third channel structure.

Example 20 provides the electronic device according to example 19, where a dielectric constant of the one or more first dielectric materials is smaller than a dielectric constant of the one or more second dielectric materials.

Example 21 provides the electronic device according to examples 19 or 20, where the electronic device is a computing device or a memory device.

Example 22 provides the electronic device according to examples 19 or 20, where the electronic device is an IC package.

Example 23 provides the electronic device according to any one of examples 19-22, where the further IC component includes one of a package substrate, an interposer, or a further IC die.

Example 24 provides the electronic device according to any one of examples 19-23, where the IC die includes, or is a part of, at least one of a memory device and a computing device.

Example 25 provides the electronic device according to any one of examples 19-24, where the electronic device is a wearable electronic device (e.g., a smart watch) or handheld electronic device (e.g., a mobile phone).

Example 26 provides the electronic device according to any one of examples 19-25, where the electronic device further includes one or more communication chips and an antenna.

Example 27 provides the electronic device according to any one of examples 19-26, where the electronic device is an RF transceiver.

Example 28 provides the electronic device according to any one of examples 19-27, where the further IC component is a motherboard.

Example 29 provides the electronic device according to any one of examples 19-28, where the IC die includes the IC structure according to any one of examples 1-18.

Example 30 provides a method for fabricating an IC structure, the method including providing a first and a second channel structures (e.g., first and second fins or nanoribbons), the first and second channel structures including one or more semiconductor materials; providing a gate electrode material, having a first portion at least partially wrapping around a portion of the first channel structure and having a second portion at least partially wrapping around a portion of the second channel structure; providing a power rail, extending in a horizontal direction to be parallel to and between the first and the second channel structures, and extending in a vertical direction by having a top of the power rail below bottoms of the first and second portions of the gate electrode material; providing an opening, extending in the horizontal direction to be parallel to and above the power rail, and extending in the vertical direction from the top of the power rail to tops of the first and second portions of the gate electrode material, the opening having a first portion as a portion of the opening that is between the first and second portions of the gate electrode material, and further having a second portion as a portion of the opening that is not between the first and second portions of the gate electrode material; at least partially filling the first portion of the opening with one or more dielectric materials; and at least partially filling the second portion of the opening with one or more electrically conductive materials, where the one or more electrically conductive materials are coupled to the power rail.

Example 31 provides the method according to example 30, further including providing a transistor that has a channel that includes a portion of the second channel structure and a gate that includes the second portion of the gate electrode material, and electrically coupling the one or more electrically conductive materials of the second portion of the opening to a source or a drain (S/D) region of the transistor.

Example 32 provides the method according to examples 30 or 31, further including processes for forming the IC structure according to any one of the preceding examples (e.g., according to any one of examples 1-18) or the electronic device according to any one of the preceding examples (e.g., according to any one of examples 19-29).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
a first and a second channel structures;
a gate electrode material having a first portion at least partially wrapping around a portion of the first channel structure and having a second portion at least partially wrapping around a portion of the second channel structure;
a power rail parallel to and between the first and the second channel structures, and having a top of the power rail below a bottom of the gate electrode material; and
an opening parallel to and above the power rail, and extending from the top of the power rail to tops of the first and second portions of the gate electrode material, the opening having a first portion as a portion of the opening that is between the first and second portions of the gate electrode material, and further having a second portion as a portion of the opening that is not between the first and second portions of the gate electrode material,
wherein the first portion of the opening is at least partially filled with one or more dielectric materials, and the second portion of the opening is at least partially filled with one or more electrically conductive materials.

2. The IC structure according to claim 1, wherein a width of the first portion of the opening is substantially equal to a width of the second portion of the opening.

3. The IC structure according to claim 1, wherein widths of the first and the second portions of the opening are smaller than a width of the power rail.

4. The IC structure according to claim 1, wherein widths of the first and the second portions of the opening are substantially equal to a width of the power rail.

5. The IC structure according to claim 1, wherein the top of the power rail is below the bottom of the gate electrode material by at least 5 nanometers.

6. The IC structure according to claim 1, wherein the one or more electrically conductive materials of the second portion of the opening are in contact with one or more electrically conductive materials of the power rail.

7. The IC structure according to claim 1, wherein the one or more electrically conductive materials of the second portion of the opening are electrically coupled to the power rail and to a source or a drain (S/D) contact of a transistor, and wherein:
 either the transistor has a channel that includes a portion of the first channel structure and a gate that includes the first portion of the gate electrode material,
 or the transistor has the channel that includes a portion of the second channel structure and the gate that includes the second portion of the gate electrode material.

8. The IC structure according to claim 7, further comprising:
 a first trench contact, over and coupled to the S/D contact material of the transistor; and
 a second trench contact, over and coupled to the first trench contact,
 wherein the one or more electrically conductive materials of the second portion of the opening are coupled to the second trench contact and self-aligned to the second trench contact in a direction parallel to a length of the power rail.

9. The IC structure according to claim 7, further comprising:
 a first trench contact, over and coupled to the S/D contact material of the transistor; and
 a second trench contact, over and coupled to the first trench contact,
 wherein the one or more electrically conductive materials of the second portion of the opening are coupled to the second trench contact and the second trench contact does not fully overlap with the second portion of the opening in a direction perpendicular to a length of the power rail and parallel to a support structure over which the IC structure is provided.

10. The IC structure according to claim 1, wherein:
 the gate electrode material is a first gate electrode material,
 the opening is a first opening,
 the one or more electrically conductive materials are one or more first electrically conductive materials, and
 the IC structure further includes:
  a third channel structure, including the one or more semiconductor materials,
  a second gate electrode material, having a first portion at least partially wrapping around a portion of the third channel structure and having a second portion at least partially wrapping around a portion of the first channel structure, and
  a second opening that is between the first and second portions of the second gate electrode material and extends from tops of the first and second portions of the second gate electrode material to below bottoms of the first and second portions of the second gate electrode material,
  wherein the second opening is at least partially filled with one or more second dielectric materials.

11. The IC structure according to claim 10, further comprising a seam in the one or more second dielectric materials.

12. The IC structure according to claim 10, wherein:
 the IC structure further includes a support structure, having a first face and an opposing second face,
 the first, second, and third channel structures are over different portions of the second face of the support structure, and
 a distance between the first face of the support structure and a bottom of the second opening is different from a distance between the first face of the support structure and a bottom of the first opening.

13. The IC structure according to claim 10, wherein a material composition of the one or more second dielectric materials is different from a material composition of the one or more first dielectric materials.

14. The IC structure according to claim 10, wherein a dielectric constant of the one or more first dielectric materials is smaller than a dielectric constant of the one or more second dielectric materials.

15. The IC structure according to claim 10, wherein the second opening electrically isolates the first portion of the second gate electrode material from the second portion of the second gate electrode material.

16. An electronic device, comprising:
 an integrated circuit (IC) die; and
 a further IC component, coupled to the IC die,
 wherein the IC die includes:
  a first and a second channel structures,
  a gate electrode material having a first portion at least partially wrapping around a portion of the first channel structure and having a second portion at least partially wrapping around a portion of the second channel structure,
  a power rail parallel to and between the first and the second channel structures, and having a top of the power rail below a bottom of the gate electrode material, and
  an opening parallel to and above the power rail, and extending from the top of the power rail to tops of the first and second portions of the gate electrode material, the opening having a first portion as a portion of the opening that is between the first and second portions of the gate electrode material, and further having a second portion as a portion of the opening that is not between the first and second portions of the gate electrode material,
  wherein the first portion of the opening is at least partially filled with one or more dielectric materials, and the second portion of the opening is at least partially filled with one or more electrically conductive materials.

17. The electronic device according to claim 16, wherein the electronic device is a memory device.

18. The electronic device according to claim 16, wherein the electronic device is a computing device.

19. A method for fabricating an integrated circuit (IC) structure, the method comprising:
 providing a first and a second channel structures;
 providing a gate electrode material, having a first portion at least partially wrapping around a portion of the first channel structure and having a second portion at least partially wrapping around a portion of the second channel structure;
 providing a power rail, parallel to and between the first and the second channel structures, wherein a top of the power rail is below bottoms of the first and second portions of the gate electrode material; and
 providing an opening, parallel to and above the power rail, wherein the opening extends from the top of the power rail to tops of the first and second portions of the gate electrode material, the opening has a first portion as a portion of the opening that is between the first and second portions of the gate electrode material, and the opening further has a second portion as a portion of the opening that is not between the first and second portions of the gate electrode materials, wherein the first portion of the opening is at least partially filled with one or more dielectric materials, and the second portion of the opening is at least partially filled with one or more electrically conductive materials.

20. The method according to claim 19, further comprising:

providing a transistor that has a channel that includes a portion of the second channel structure and a gate that includes the second portion of the gate electrode material, and electrically coupling the one or more electrically conductive materials of the second portion of the opening to a source or a drain (S/D) region of the transistor.

* * * * *

UNITED STATES PATENT AND TRADEMARK OFFICE
CERTIFICATE OF CORRECTION

PATENT NO. : 12,327,791 B2
APPLICATION NO. : 17/209304
DATED : June 10, 2025
INVENTOR(S) : Andy Chih-Hung Wei Page 1 of 1

It is certified that error appears in the above-identified patent and that said Letters Patent is hereby corrected as shown below:

In the Claims

In Column 37, Claim 19, Line 2, delete "materials," and insert -- material, --, therefor Signed and Sealed this
Second Day of September, 2025

Coke Morgan Stewart
*Acting Director of the United States Patent and Trademark Office*